(12) United States Patent
Koyama et al.

(10) Patent No.: US 7,387,452 B2
(45) Date of Patent: Jun. 17, 2008

(54) SEMICONDUCTOR LASER MODULE

(75) Inventors: Etsuo Koyama, Tokyo (JP); Hiroyoshi Matsumura, Tokyo (JP); Shojiro Hayashi, Tokyo (JP)

(73) Assignee: Tecdia Co., Ltd., Tokyo (JP)

( * ) Notice: Subject to any disclaimer, the term of this patent is extended or adjusted under 35 U.S.C. 154(b) by 0 days.

(21) Appl. No.: 11/716,674

(22) Filed: Mar. 12, 2007

(65) Prior Publication Data

US 2008/0089643 A1    Apr. 17, 2008

(51) Int. Cl.
*G02B 6/36* (2006.01)
(52) U.S. Cl. .......................... 385/93; 385/33
(58) Field of Classification Search ............ 385/93, 385/33
See application file for complete search history.

(56) References Cited

U.S. PATENT DOCUMENTS

| | | | | |
|---|---|---|---|---|
| 4,784,466 | A | * | 11/1988 | Khoe et al. .............. 385/33 |
| 5,446,816 | A | * | 8/1995 | Shiraishi et al. .......... 385/33 |
| 6,130,972 | A | * | 10/2000 | Shiraishi et al. .......... 385/33 |
| 6,272,269 | B1 | * | 8/2001 | Naum ..................... 385/43 |
| 7,099,535 | B2 | * | 8/2006 | Bhagavatula et al. ...... 385/33 |
| 2003/0072525 | A1 | * | 4/2003 | Sjodin et al. ............. 385/31 |

FOREIGN PATENT DOCUMENTS

| | | |
|---|---|---|
| JP | 05-121841 | 5/1993 |
| JP | 09-251120 | 9/1997 |
| JP | 2005-115097 | 4/2005 |

* cited by examiner

*Primary Examiner*—Ellen Kim
(74) *Attorney, Agent, or Firm*—Nixon & Vanderhye P.C.

(57) ABSTRACT

The object of the present invention is to provide a semiconductor laser module capable of reducing the burdens for the arrangement of the optical system than the conventional one. The semiconductor laser module comprises: a semiconductor laser 1 for emitting, as a transmitted light, a light with a wavelength within a certain communication wavelength band such as, for example, 1.3 .mu.m band; a cooling means 2a, 2b for cooling the semiconductor laser 1; a stem 3 and cap 4 composing a package; a coupling lens 5, to which the transmitted light leaving the semiconductor laser 1 enters; an optical fiber 8, with which a coupling lens 5 is connected by fusion on its edge face, for optically coupling the transmitted light via the coupling lens 5 thereby propagating; a lens mount piece 6 for fixing and mounting at least a portion of the coupling lens 5 or optical fiber 8; an optical fiber holder 7 for holding the optical fiber 8; and a mount substrate 9, to which the cooling means 2a, 2b and the lens mount piece 6 are disposed; wherein the coupling lens 5 consists of a first GRIN lens portion with a numerical aperture larger than or equal to that of the numerical aperture NAI of the semiconductor laser 1 multiplied by 1.4, and a second GRIN lens portion 5b with a numerical aperture similar to that of the SMF 8.

4 Claims, 6 Drawing Sheets

SEMICONDUCTOR LASER MODULE

BACKGROUND OF THE INVENTION

The present invention relates to a semiconductor laser module to be optically coupled to the optical fiber, particularly to, a semiconductor laser module to be optically coupled to the optical fiber provided to the branch line, subscriber line, and the like.

In recent years, even in the branch line system, subscriber line system and the like (hereinafter, referred to simply as "subscriber line system"), a Single Mode Fiber (hereinafter, referred to simply as "SMF") has been used and spread from the point of view of the high speed data transmission. Usually, for such as upload from a communication apparatus in home, a semiconductor laser is used as a light source and positioned so as to efficiently couple to the optical fiber.

FIG. 7 is a cross-sectional view illustrating an exemplary configuration of a conventional semiconductor laser module using a micro lens (refer, for example, to the patent document 1). In FIG. 7, a semiconductor laser 71 is arranged such that it is mounted on a heat sink 72 inside a package consisting of a stem 73 and cap 74 and optically couples to a SMF in a ferrule 78 via a micro lens 75 and spherical lens 76 held inside the sleeve 77. Hereat, a transmitted light from the semiconductor laser 71 is transformed to a parallel beam by the micro lens 75 working as a collimator, and then collected to the core in the cross section of the SMF by the spherical lens 76 working as a collective lens to couple to the SMF, and thereby propagating inside the SMF.

This semiconductor laser module is assembled as follows. First, the semiconductor laser 71 and micro lens 75 are positioned, and then the cap 74 is solidly attached to the stem 73 thereby ceiling the semiconductor laser 71. Next, the optical fiber ferrule 78 is inserted into the sleeve 77, in which the spherical lens 76 is aligned inside, next, the sleeve 77 is put on the cap 74, and then adjustment of positioning is performed between the sleeve 77 and the cap 74 with respect to the x axis and y axis. Finally, an adjustment of positioning is performed between the spherical lens 76 and the ferrule 78 with respect to the z axis, and then, at the position where optical coupling is optimal, the welding portions 79a, 79b are fixed by spot-welding technique using YAG laser.

FIG. 8 is a cross-sectional view illustrating an exemplary configuration of the semiconductor laser module of conventional butterfly-type (refer, for example, to the patent document 2). In FIG. 8, a semiconductor laser 81 is arranged such that it is aligned on a heat sink 82a mounted inside the package consisting of a stem 83 and cap 84 and optically couples to a SMF 88 held by an optical fiber holder 87 via a collective lens 85 held inside the package by a lens holder 86a and supporting stick 86b. Here, the heat sink 82a is aligned to connect with an electronic cooling device 82c such as a Peltier device via a substrate 82b with a high thermal conductivity so as to have low thermal resistance. Further, arrangements for securing the optical coupling are carried out between the semiconductor laser 81 and the collective lens 85 and also between the collective lens 85 and the optical fiber holder 87, with respect to the 3 directions: the x-, y-, and z-axes.

[Patent document 1] Japanese Patent Application Laid-Open Publication No. 05-121841

[Patent document 2] Japanese Patent Application Laid-Open Publication No. 09-251120

However, the conventional semiconductor laser module has a problem that severe arrangement burdens are required to perform the 2- or 3-dimensional positioning among the semiconductor laser, SMF, and the lens system aligned therebetween, in order to keep the optical coupling between the semiconductor laser and SMF high. Owing to these arrangement burdens required for the positioning, it is difficult to realize a compact arrangement, a low price, etc suitable for market use.

Considering the aforementioned present situation, the object of the present invention is to provide a semiconductor laser module capable of reducing the arrangement burdens required to the positioning of the optical system than the conventional one.

SUMMARY OF THE INVENTION

The aforementioned objective is achieved by the following configurations.

(1) According to the claim 1, there is provided a semiconductor laser module comprising: a semiconductor laser for emitting a transmitted light; an optical fiber for optically coupling the transmitted light leaving the semiconductor laser and propagating inside; a coupling lens, which is a cylindrical lens connected by fusion with the edge face of the optical fiber and positioned on an optical path between the optical fiber and the semiconductor laser, consisting of a first GRIN lens portion, which has a numerical aperture larger than or equal to that of the semiconductor laser multiplied by 1.4 and parallelizes the incident transmitted light and is aligned at the semiconductor laser side, and a second GRIN lens portion, which has the same numerical aperture as the optical fiber and is positioned at the optical fiber side and optically couples the transmitted light passed through the first GRIN lens portion with the optical fiber; a lens mount piece for fixing to support at least one portion of the coupling lens or optical fiber so as to be capable of optically coupling the transmitted light leaving the semiconductor laser with the optical fiber via the coupling lens.

(2) According to the claim 2, there is provided a semiconductor laser module according to claim 1, wherein the second GRIN lens portion has a length of a quarter of the meander period of the transmitted light propagating inside along the optical path direction.

(3) According to the claim 3, there is provided a semiconductor laser module according to claim 1, wherein the second GRIN lens portion is divided into a collimator lens portion connected by fusion with the first GRIN lens portion and a collective lens portion connected by fusion with the optical fiber so as to be capable of aligning an optical isolator therebetween.

(4) According to the claim 4, there is provided a semiconductor laser module according to claim 1, wherein the lens mount piece has, at least, a groove for fixing to support the coupling lens inside.

According to the present invention defined in claim 1, since the semiconductor laser module comprises: a semiconductor laser for emitting a transmitted light; an optical fiber for optically coupling the transmitted light leaving the semiconductor laser and propagating inside; a coupling lens, which is a cylindrical lens connected by fusion with the edge face of the optical fiber and positioned on an optical path between the optical fiber and the semiconductor laser, consisting of a first GRIN lens portion, which has a numerical aperture larger than or equal to that of the semiconductor laser multiplied by 1.4 and parallelizes the incident transmitted light and is aligned at the semiconductor laser side, and a second GRIN lens portion, which has the same numerical aperture as the optical fiber and is positioned at the optical fiber side and optically couples the transmitted light passed through the first GRIN lens portion with the optical fiber; a lens mount piece for fixing to support at least one portion of the coupling lens or optical fiber so as to be capable of optically coupling the transmitted light leaving the semiconductor laser with the optical fiber via the coupling lens, arrangements can be carried out as if by positioning a single SMF relative to the semiconductor laser, and thereby allowing to realize a semiconductor laser module capable of reducing the arrangement burdens required to the positioning of the optical system than the conventional one.

According to the present invention defined in claim 2, since the second GRIN lens portion has a length of a quarter of the meander period of the transmitted light propagating inside along the optical path direction, in addition to the aforementioned advantage of the invention defined in claim 1, it is possible to realize an apparatus with a compact configuration and lower loss.

According to the present invention defined in claim 3, since the second GRIN lens portion is divided into a collimator lens portion connected by fusion with the first GRIN lens portion and a collective lens portion connected by fusion with the optical fiber so as to be capable of aligning an optical isolator therebetween, in addition to the aforementioned advantage of the invention defined in claim 1, it is possible to dispose an optical isolator for reducing the return light to the semiconductor laser, and thereby allowing to improve the reliability.

According to the present invention defined in claim 4, since the lens mount piece has, at least, a groove for fixing to support the coupling lens inside, in addition to the aforementioned advantage of the invention defined in claim 1, it is possible to further reduce the arrangement burdens required to the positioning of the optical system than the conventional one.

DETAILED DESCRIPTION OF THE PREFERRED EMBODIMENTS

Figure 1:
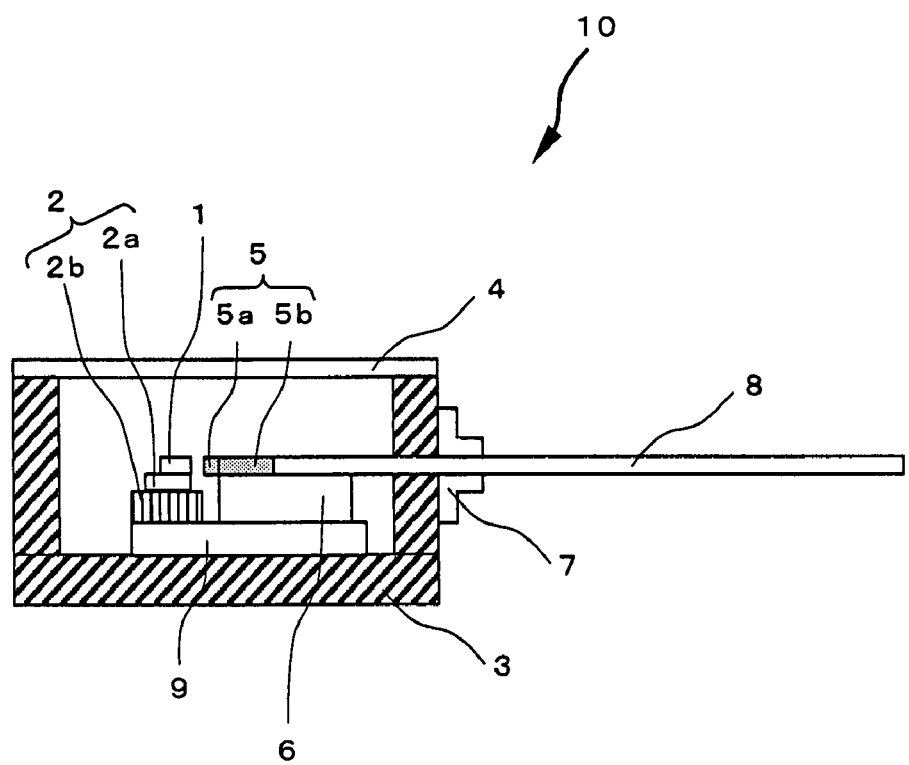
FIG. 1 is a cross-sectional view illustrating a semiconductor laser module of the first embodiment according to the present invention.

Hereinafter, referring to the drawings illustrating embodiments, the embodiments of the present invention will be described.

FIG. 1 is a cross-sectional view illustrating a semiconductor laser module of the first embodiment according to the present invention. The semiconductor laser module 10 comprises:, as shown in FIG. 1, a semiconductor laser 1 for emitting, as a transmitted light, a light with a wavelength within a certain communication wavelength band such as, for example, 1.3 .mu.m band; a cooling means 2a, 2b for cooling the semiconductor laser 1; a stem 3 and cap 4 composing a package; a coupling lens 5, to which the transmitted light leaving the semiconductor laser 1 enters; an optical fiber 8, with which a coupling lens 5 is connected by fusion on its edge face, for optically coupling the transmitted light via the coupling lens 5 thereby propagating; a lens mount piece 6 for fixing and mounting at least a portion of the coupling lens 5 or optical fiber 8; an optical fiber holder 7 for holding the optical fiber 8; and a mount substrate 9, to which the cooling means 2a, 2b and the lens mount piece 6 are disposed.

The semiconductor laser 1 has a certain numerical aperture such as 0.28-0.34, and is aligned on the mount substrate 9 via the cooling means 2a, 2b, so as that the transmitted light leaving it enters the coupling lens 5. The semiconductor laser 1 is arranged such that being mounted on the cooling member 2a with a high thermal conductivity, thermally contacting with an electronic cooling device 2b consisting of such as a Peltier cooling device via the cooling member 2a, and thereby being cooled. Hereat, the electronic cooling device 2b is not inevitable, and the semiconductor laser 1 may be thermally, directly connected to such as an external heat sink via the cooling means 2a and the mount substrate 9.

The optical fiber 8 generally consists of a core with a relatively higher refraction index in the central portion and a clad with a relatively lower refraction index circumferential about it, wherein the diameter of the core is about 10 .mu.m, and the diameter of the clad (diameter of the fiber) is about 125 .mu.m. Hereinafter, explanations will be described by considering the use of the SMF as an optical fiber.

Figure 2:
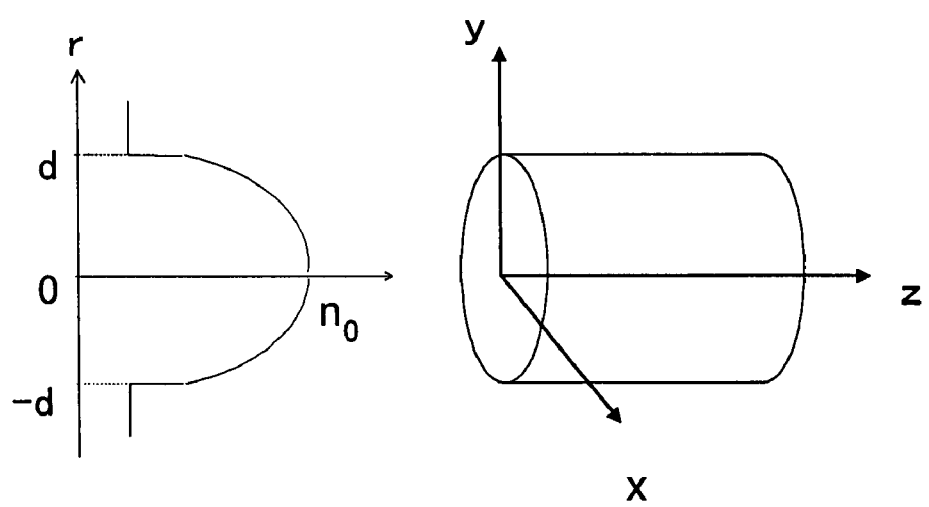
FIG. 2 is a view schematically showing the refraction index distribution of the coupling lens according to the present invention.

The coupling lens 5 is a cylindrical lens aligned on the optical path between the SMF 8 and the semiconductor laser 1, connected by fusion on the edge face of the SMF 8, and is arranged so as to optically couple the transmitted light leaving from the semiconductor laser 1 to the SMF 8. FIG. 2 is a view schematically showing the refraction index distribution of the coupling lens according to the present invention. As shown in FIG. 2, the coupling lens 5 has a refraction index with axial symmetry with respect to the optical axis, and a cylindrical shape. Here, the refraction index distribution n (r) along the radial direction of the coupling lens 5 is approximately depicted by a parabolic function, which has a maximum at the optical axis and is expressed by, for example, the equation (1) described below, $$n(r) = n_0 [1 - (gr)^2/2] \quad (1)$$

where $n_0$ is a maximum of the refraction index distribution, r is a distance along the radial direction, and g is a constant relating to the focal power of the lens.

The refraction index distribution like this is realized by applying, for example, the fabrication technique (refer to the Japanese Patent Application Laid Open Publication No. 2005-115097) for such as so-called GRIN (GRaded INdex) lens with a refraction index gradually changing. Concretely, it is realized by making a dry gel with a graded refraction index using Sol-Gel technique, sintering the obtained dry gel, and spinning it. Besides, the coupling lens 5 may also be separated into two cylindrical portions consisting of a portion 5*a* distal with respect to the SMF 8 (hereinafter, referred to as "first GRIN lens portion") and the remaining portion (hereinafter, referred to as "second GRIN lens portion") 5*b*. Hereinafter, explanations will be described by considering that the coupling lens 5 has a diameter similar to that of the SMF 8 and consists of the first GRIN lens portion 5*a* and the second GRIN lens portion 5*b* with a numerical aperture less than that of the first GRIN lens portion 5*a*. Here, "a diameter similar to that of the SMF 8" means a diameter with a tolerance defined depending on the domestic standards and/or international standards for SMF diameter. Concretely, in case of using a ferrule with a maximum inner diameter of 126 .mu.m, the diameter corresponds to that with the tolerance of about 5 .mu.m or 1.1%.

Here, in order that the transmitted light leaving from the semiconductor laser 1 is optically coupled to, the first GRIN lens portion has a numerical aperture NA1 larger than the numerical aperture NAI of the semiconductor laser 1. Besides, the second GRIN lens portion 5*b* has a numerical aperture NA2 smaller than the numerical aperture NA1 of the first GRIN lens portion 5*a* and similar to that of the SMF 8. The numerical aperture NA1 of the first GRIN lens portion 5*a* is expressed by Eq. (2) below, with the aforementioned constant, $$NA1 = n \circ g \, d \quad (2)$$

where d indicates the radius of the first GRIN lens portion 5*a*.

Figure 3:
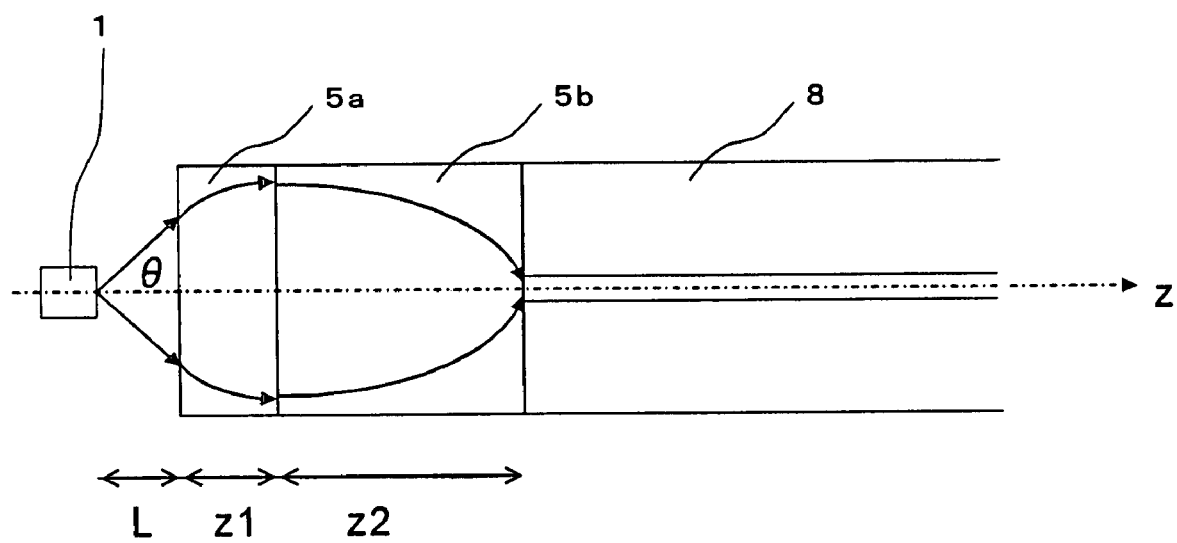
FIG. 3 is a schematic view explaining the relative position between the semiconductor laser and the coupling lens.

FIG. 3 is a schematic view explaining the relative position between the semiconductor laser and the coupling lens. As shown in FIG. 3, the semiconductor laser 1 is aligned so as that the edge face of its emitting side is separated from the opposite edge face of the first GRIN lens portion 5*a* with a certain distance (hereinafter, referred to as "laser-lens distance".) L. This aims to avoid a damage and the like caused by contacting the semiconductor laser 1 with the coupling lens 5. Here, the length of the first GRIN lens portion 5*a* along the optical axial direction is z1, that of the second GRIN lens portion 5*b* is z2, and the second GRIN lens portion 5*b* and SMF 8 facially contact by fusion at their respective opposite edge faces with their optical axes aligned.

Here, the first GRIN lens portion 5*a* has a length z1 selected so as that the transmitted light entering to it is transformed into a parallel beam at the interface with the second GRIN lens portion 5*b*. Further, the length z2 of the second GRIN lens portion 5*b* is adjusted to a quarter of the meander period of the light propagating inside it. The coupling lens 5 according to the present invention is formed so as that the numerical aperture NA1 of the first GRIN lens portion 5*a* is larger than the numerical aperture NAI of the semiconductor laser 1 multiplied by 1.4.

Since the coupling lens 5 is aligned separated from the semiconductor laser 1 as mentioned above, thereby simply making the numerical aperture of the first GRIN lens portion 5*a* larger than that of the semiconductor laser, effective optically coupling to the semiconductor laser 1 may be obtained in some case, and an unintentional stray light may result in. Here, the laser-lens distance L is adjusted in the range of 50-120 .mu.m in the usual assembly of the semiconductor laser module. Further, generally, a semiconductor laser with a numerical aperture such as 0.28, 0.30, 0.34, etc. is used for the semiconductor laser module.

Figure 4:
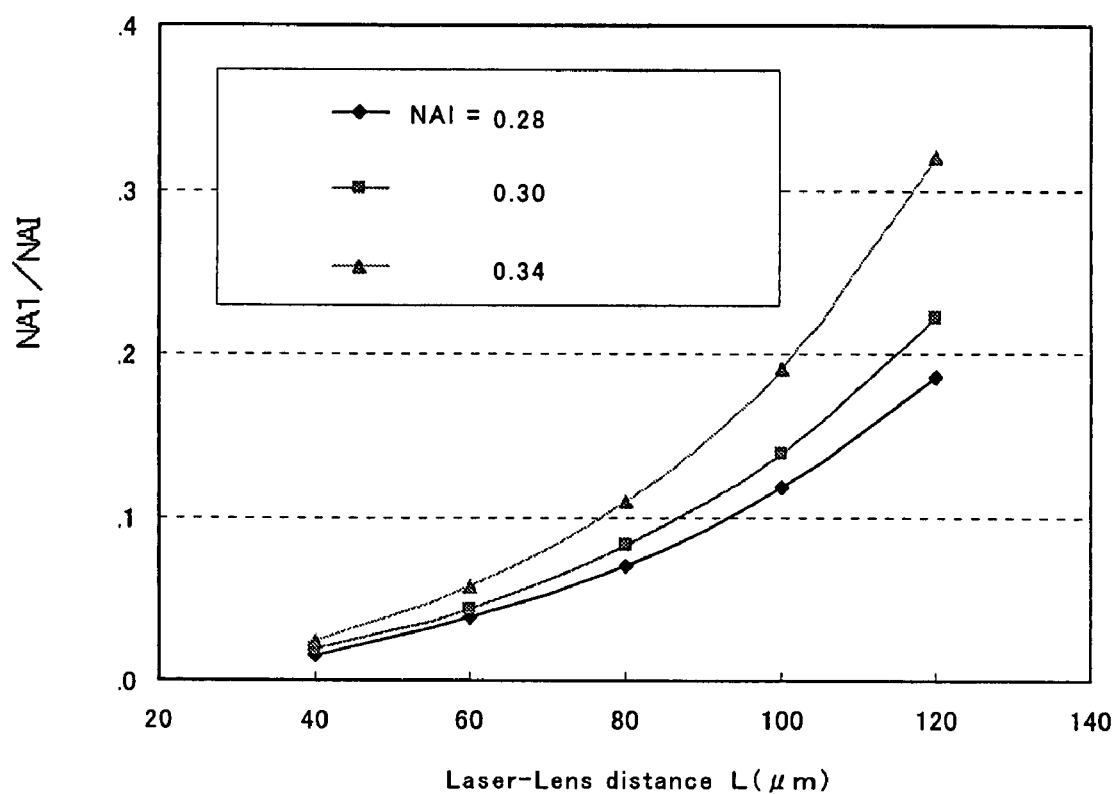
FIG. 4 is a view illustrating the relation between the laser-lens distance and the numerical aperture required to the first GRIN lens portion.

FIG. 4 is a view illustrating the relation between the laser-lens distance and the numerical aperture required to the first GRIN lens portion. Here, the ordinate of the graph shown in the FIG. 4 represents the numerical aperture NA1 of the first GRIN lens portion 5*a* divided by the numerical aperture NAI of the semiconductor laser 1. Here, the numerical aperture NA1 required to the first GRIN lens portion 5*a* shown in FIG. 4 is determined based on Eq. (3) described below by taking into account of the laser-lens distance.

$$NA1 >= [(1/NAI).sup.2. - (L/d).sup.2.].sup.(-½). \quad (3)$$

Further, in the graph shown in FIG. 4, 0.28, 0.30, and 0.34 are selected as values for the numerical aperture NAI of the semiconductor laser 1.

Based on the Eq. (3), if the laser-lens distance L is selected to 0, it can be seen that the numerical aperture NA1 of the first GRIN lens portion 5*a* is enough if larger than the numerical aperture NAI of the semiconductor laser 1. However, in case that the laser-lens distance is not selected to 0, this condition alone is not enough to effectively obtain the optical coupling. If the numerical aperture NA1 of the first GRIN lens portion 5*a* is larger than the numerical aperture NAI of the semiconductor laser 1 multiplied by 1.4, as clearly from FIG. 4, it is possible to assemble by adopting a semiconductor laser with a common numerical aperture and positioning it with a common laser-lens distance. Besides, this factor 1.4, since being selected to have a leeway, is selected to a value, which allows to appropriately assembling even if taking into account the practical positioning errors.

Owing to the configuration of the coupling lens 5 like this, the transmitted light entering the first GRIN lens portion 5*a*, as shown in FIG. 3, is firstly transformed to change into a parallel beam toward the interface with the second GRIN lens portion 5*b*, by the first GRIN lens portion 5*a* with the aforementioned numerical aperture NA1 and length z1. Next, the transmitted light incident to this interface is collected to the SMF 8 by the second GRIN lens portion 5*b*, which has substantially the same numerical aperture as that of the SMF 8 and a length of quarter of the meander period of the propagating light, and is optically coupled to the SMF 8 with an substantially constant numerical aperture, thereby propagating into.

The lens mount piece, as shown in FIG. 1, is aligned on the mount substrate 9 so as that it supports a portion of the coupling lens 5 and SMF 8 and the transmitted light leaving from the semiconductor laser 1 optically is coupled to the SMF8 via the coupling lens 5. For this purpose, the lens mount piece 6 can be formed with a groove such as, for example, a V-shaped groove, in which the coupling lens 5 and SMF 8 are aligned and fixed by the YAG laser welding technique. Hereat, the semiconductor laser 1 mounted on the cooling means 2*a* is soldered on an electronic cooling device 2*b*, and the electronic cooling device 2*b* and the lens mount piece 6 are soldered on the mount substrate 9, respectively. Besides, the mount substrate 9 is soldered on the bottom face of the stem 3 composing the package. Further, the SMF 8 is fixed to the optical fiber holder 7 by the YAG laser welding technique, and further the optical fiber holder 7 is fixed on the side surface of the stem 3 by the YAG laser welding technique.

Hereinafter, explanations will be described on the further detailed example of forming the coupling lens 5 according to the present invention.

EXAMPLE 1

First, to the mixed solution consisting of Silicon Tetramethoxide of 75.5 mL and Iso-propanol of 183.4 mL, hydrochloric acid (2N) of 9.2 mL is added, followed by stirring for 30 minutes, and Titan Tetra-n-butoxide of 9.8 mL is added thereafter. Next, ammonia solution (0.01 N) is added to the obtained mixed solution, followed by stirring, and a wet gel is obtained by maturing at 50 degree C. for 2 days. Next, this wet gel is soaked in the hydrochloric acid (6N) for 2 hours, thereby rendering the concentration distribution in the gel by means of dissolving Titanium of its outer potion out. After the soak, a dry gel with a diameter of about 10 mm is obtained by drying at 70 degree C. The obtained dry gel is heated up from the room temperature to 800 degree C. with a rate of 150 deg./hr in an oxygen atmosphere, then to 1250 degree C. with a rate of 50 deg./hr in a helium atmosphere, and sintered for 2 hours. After the sinter, a cylindrical glass body is formed by cooling down for 15 hours. Thereby, there is obtained a parent material with a refraction distribution decreasing parabolically from the center to the periphery, for the second GRIN lens with NA of 0.11.

Next, to the mixed solution consisting of Silicon Tetramethoxide of 75.5 mL and Iso-propanol of 183.4 mL, hydrochloric acid (2N) of 9.2 mL is added, followed by stirring for 30 minutes, and Titan Tetra-n-butoxide of 30.8 mL is added thereafter. Next, ammonia solution (0.01 N) is added to the obtained mixed solution, followed by stirring, and a wet gel is obtained by maturing at 50 degree C. for 2 days. Next, as a first process for rendering a Ti concentration distribution, this wet gel is soaked in hydrochloric acid (6N) for 2 hours, and then the obtained wet gel is soaked in the methanol, thereby washing the hydrochloric acid component out. Next, as a second process for rendering a Ti concentration distribution, this wet gel is soaked in hydrochloric acid (6N) for 20 minutes, and then the obtained wet gel is soaked in the methanol, thereby washing the hydrochloric acid component out. Next, as a third process for rendering a Ti concentration distribution, this wet gel is soaked in the hydrochloric acid (6N) for 8 minutes, and then the obtained wet gel is soaked in the methanol, thereby washing the HCl component out. Next, a dry gel with a diameter of about 10 mm is obtained by drying at 70 degree C. The obtained dry gel is heated up from the room temperature to 350 degree C. with a rate of 10 deg./hr, then to 1200 degree C., and sintered for 2 hours, and thereby a cylindrical glass body is formed. Thereby, there is obtained a parent material with a refraction distribution decreasing parabolically from the center to the periphery, for the first GRIN lens with NA of 0.5. As described above, the enlargement of the numerical aperture of the GRIN lens is possible by means of performing a plurality of renders of the Ti concentration distribution to the wet gel.

There are fabricated fibers for forming the first GRIN lens portion and second GRIN lens portion with a diameter of 125 .mu.m by inserting these respective parent materials into the furnace with a carbon heater from a terminal port, with a rate of 0.04 mm/sec, followed by spinning it from the other terminal port. Next, they are cut into a fiber for forming the second GRIN lens portion with a numerical aperture of 0.11 and that for the SMF with a numerical aperture of 0.11 using a fiber cutter, and further connected by fusion at each their opposite cross-sections using an optical fiber fusion splicer. Next, using the fiber cutter, this fiber connected with the SMF 8 is cut to the length of 1339 .mu.m, a quarter of the meander period of the light propagating inside, and thereby forming the second GRIN lens portion 5*b*. Similarly, the fiber for forming the first GRIN lens portion is cut using the fiber cutter, and then the fiber for forming the first GRIN lens portion is connected by fusion with the edge of the second GRIN lens portion. Next, the first GRIN lens with a length of 168 .mu.m is formed by cutting this fiber connected with the second GRIN lens portion 5*b*, followed by polishing its edge, and thereby obtaining the coupling lens 5 connected with SMF 8 by fusion.

A high coupling efficiency with a loss of less than or equal to 0.7 dB was obtained from the examination, which is performed by positioning the SMF 8 and coupling lens 5, obtained as described above, in the groove of the lens mount piece 6 formed from a glass substrate, and further the semiconductor laser 1 emitting a laser beam with a peak oscillation wavelength of 1330 nm and a beam angle (FWHM: Full Width at Half Maximum) of 20 deg. in the horizontal direction and 25 deg. in the vertical direction, so as to having the laser-lens distance L1 of 100 .mu.m. Hereat, since this examination is performed without providing an anti-reflection film on the edge face of the coupling lens, the coupling loss is calculated as a reduced value for the case of having an anti-reflection film. In this examination, the operation condition of the semiconductor laser was as follows: an operation current is selected to 16 mA, and an applied voltage to 10 V.

Respective GRIN lens portions composing the coupling lens, since consisting of Si based glass with a liner expansion coefficient of less than or equal to $15 \times 10^{-7}$. $K^{-1}$., can be connected by fusion with the SMF, using such as a burner for burning hydrogen and oxygen. As a result, a reduction is obtainable in light, which is reflected at the interface of the SMF and the coupling lens to return to the semiconductor laser. Besides, regarding the conventional connection technique using an adhesive, there is a problem that a light with a high intensity hits the adhesive to cause a temperature increase, thereby degenerating the adhesive to deteriorate the optical properties, however, this problem is also resolved by the present invention. Further, in case of the connection by fusion of the SMF with the GRIN lens, each having an similar cross-section, using the burner for burning hydrogen and oxygen, a surface tension occurred in the melted component during the process of the connection by fusion works to coincide the respective central axes of both SMF and GRIN lens with each other (hereinafter, referred to as "self-alignment effect"). Owing to this self-alignment effect, since an alignment of the central axes of the SMF and the coupling lens is easily obtainable without a precise axis alignment, which imposes usually severe burdens for the assembly, there is a particular advantage that a sharp reduction is possible in the assembly burdens necessary for the optical coupling.

Figure 5:
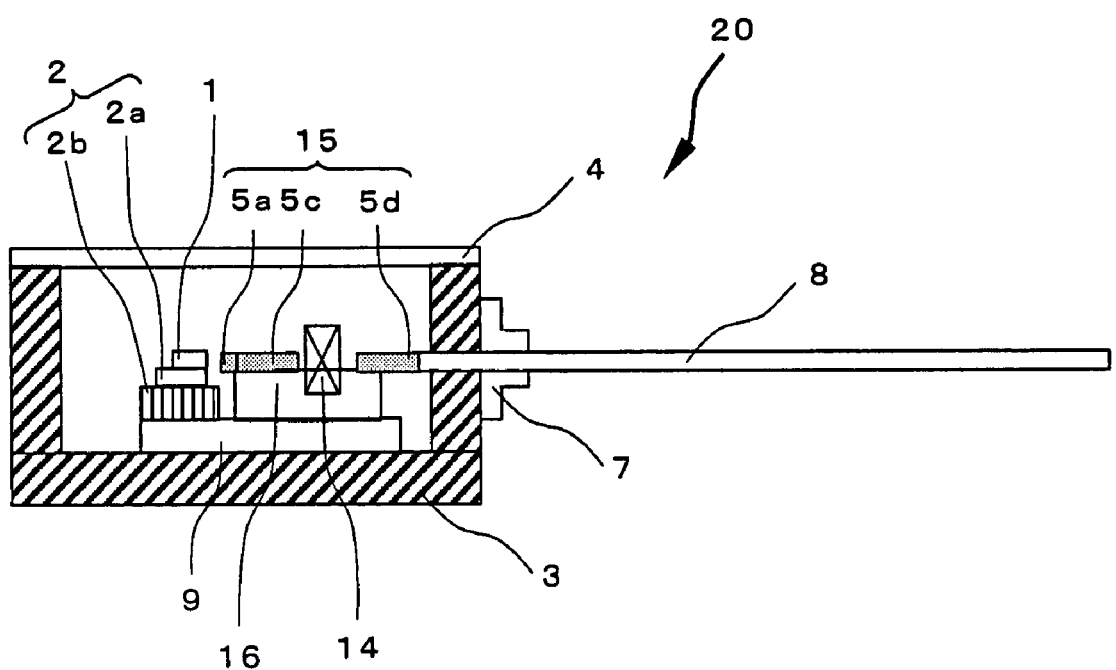
FIG. 5 is a cross-sectional view illustrating an embodiment of the configuration that an optical isolator is inserted between two intermittent GRIN lens portions.

Heretofore, although explanation is described on the configuration that the coupling lens consists of two GRIN lens portion, the first GRIN lens portion and second GRIN lens portion, the present invention is also applicable to the case that the second GRIN lens portion is divided into a collimator lens portion connected by fusion with the first GRIN lens portion and a collecting lens portion connected by fusion with an optical fiber (hereinafter, each referred to as "intermittent GRIN lens portion") so as to allow to dispose an optical isolator therebetween. FIG. 5 is a cross-sectional view illustrating an embodiment of the configuration that an optical isolator is inserted between two intermittent GRIN lens portions.

In FIG. 5, the optical isolator 14 is positioned on the lens mount piece 16 at the position between the intermittent GRIN lens portion 5*c* and intermittent GRIN lens portion 5*d*, both of which are parts of the coupling 15 consisting of the first GRIN lens portion 5*a* and intermittent GRIN lenses 5*c*, 5*d*. Hereat, the intermittent GRIN lens portion 5*c* is arranged such that its own length z3 is a little bit, such as 5%, longer than two quarters of the meander period of the light propagating inside, and the intermittent GRIN lens portion 5d is arranged such that its own length z4 is a little bit, such as 5%, longer than a quarter of the meander period of the light propagating inside. The length z3 of the intermittent lens portion 5c and the length z4 of the intermittent lens portion 5d are optimized on the basis of the optical ray equation such that the length z3 allows that a light passes through the isolator 14 as an approximately parallel beam, and the length z4 allows that the light leaving from the isolator 14 is collected by the intermittent GRIN lens portion 5d into the core of the SMF 8, thereby being optically coupled with the SMF 8. Thereby, it is possible to obtain a higher coupling efficient while effectively eliminating the light reflected at the interface between the coupling lens 15 and the SMF 8.

Figure 6:
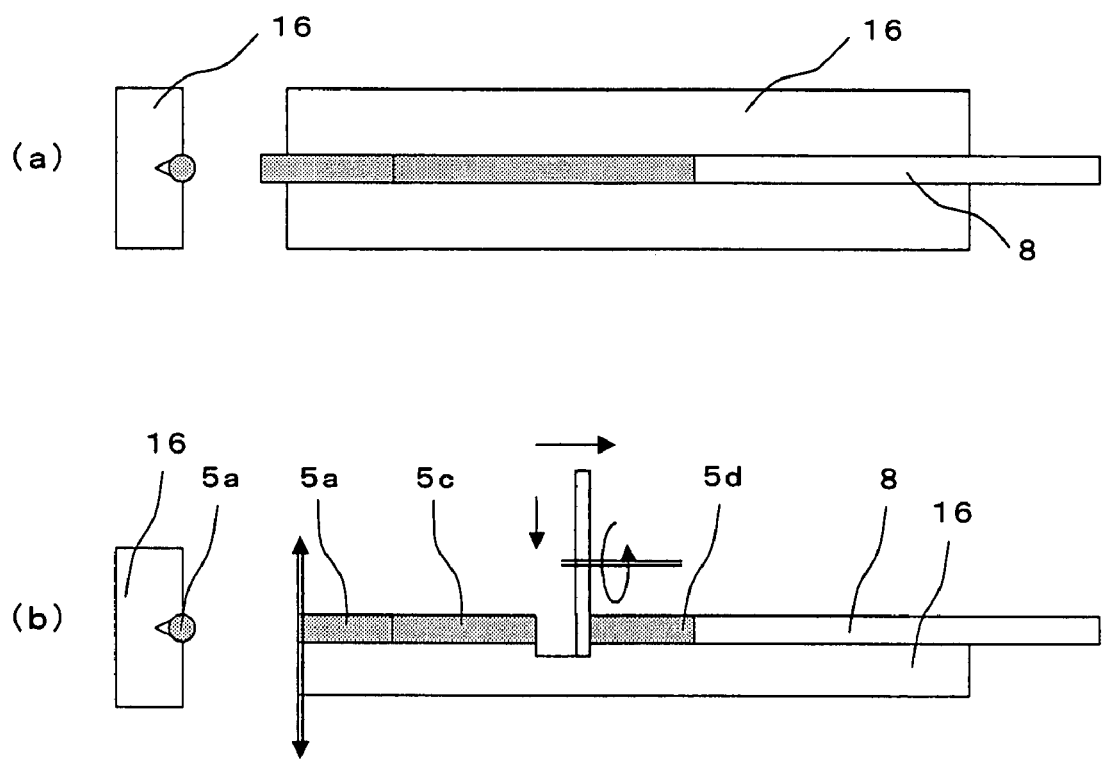
FIG. 6 is a view illustrating an example of forming the coupling lens disposed an optical isolator therein.
Figure 7:
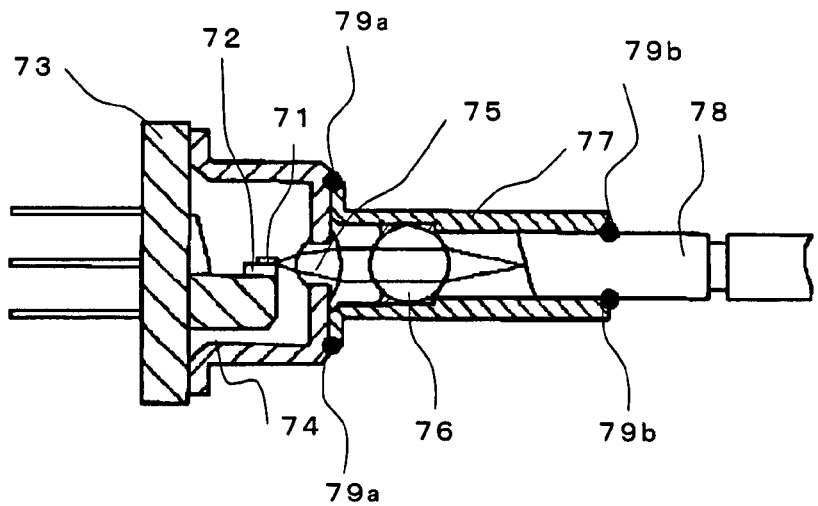
FIG. 7 is a cross-sectional view illustrating an exemplary configuration of a conventional semiconductor laser module having a micro lens.
Figure 8:
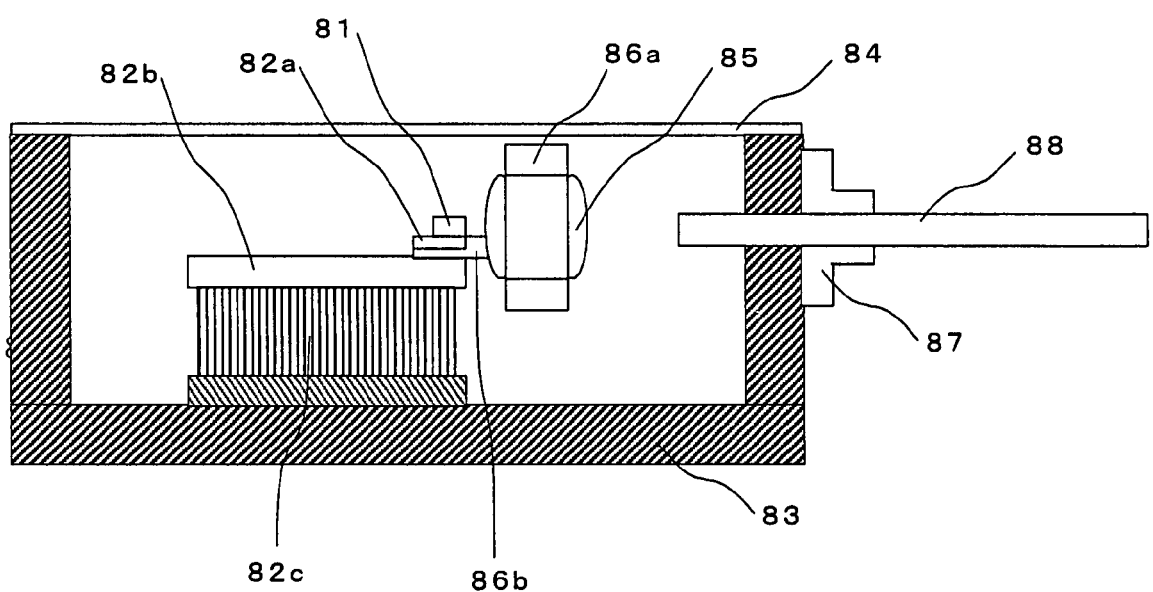
FIG. 8 is a cross-sectional view illustrating an exemplary configuration of the semiconductor laser module of conventional butterfly-type.

Hereinafter, with reference to the FIG. 6, an explanation will be described on the example of forming the aforementioned coupling lens, between whose components the optical is positioned.

EXAMPLE 2

First, using a fiber cutter, a fiber for forming the second GRIN lens portion described in Example 1 and the SMF with a numerical aperture of 0.11 are cut, and then connected with each other using an optical fiber fusion splicer, as described above. Next, using such as a fiber cutter, a fiber for forming the second GRIN lens portion is cut to the aforementioned length of approximately 7.5 mm, which is a little bit longer than the length defined as a sum of a length necessary to dispose the optical isolator, three quarters of the optical meander period, and a length necessary to polish up.

Next, using a fiber cutter, a fiber for forming the first GRIN lens portion is cut, and connected by fusion, similarly, with the edge face of the fiber for forming the aforementioned second GRIN lens portion using a optical fiber fusion splicer. Next, a fiber for forming the first GRIN lens portion is cut to the length defined as a sum of the aforementioned length, 168 .mu.m, which is a little bit longer than a quarter of the optical meander period, and a length necessary to polish up. Next, the SMF 8 connected by fusion with the cut fiber for forming the first GRIN lens portion and the fiber for forming the second GRIN lens portion is positioned in the groove of the lens mount piece 16 consisting of a glass substrate with a V-shaped groove formed in advance, and fixed using UV curing resin.

Next, as shown in FIG. 6(b), using a glass whetstone capable of rotation, a first intermittent GRIN lens portion 5c with a length of 2837 .mu.m and a second intermittent GRIN lens portion 5d with a length of 1498 .mu.m are formed by cutting and polishing, as shown in FIG. 6(b), the fiber for forming the second GRIN lens portion together with the lens mount piece 16, to be separated with a distance of 3 mm.

Next, using the glass whetstone capable of rotation, the first GRIN lens portion 5a with a length of 168 .mu.m is formed by polishing up the edge face of the fiber for forming the first GRIN lens portion together with the lens mount piece 16.

A high coupling efficiency with a loss of less than or equal to 0.7 dB was obtained from the examination, which examines the coupling efficiency for the coupling lens 5 obtained as described above under the condition similar to that described in the Example 1. Owing to the fabrication like this, a reduction is achievable in the burden necessary to align the optical axes of the respective GRIN lenses 5a, 5c, 5d and SMF 8, in a similar manner aforementioned. Further, the portion consisting of the coupling lens 15, SMF 8 and lens mount piece 16 can be manipulated similarly to the portion consisting of the coupling lens 5, SMF 8 and lens mount piece 6 shown in FIG. 1.

What is claimed is:

1. A semiconductor laser module comprising:
a semiconductor laser for emitting a transmitted light;
an optical fiber for optically coupling the transmitted light leaving the semiconductor laser and propagating inside;
a coupling lens, which is a cylindrical lens connected by fusion with the edge face of the optical fiber and positioned on an optical path between the optical fiber and the semiconductor laser, consisting of a first GRIN lens portion, which has a numerical aperture larger than or equal to that of the semiconductor laser multiplied by 1.4 and parallelizes the incident transmitted light and is aligned at the semiconductor laser side, and a second GRIN lens portion, which has the same numerical aperture as the optical fiber and is positioned at the optical fiber side and optically couples the transmitted light passed through the first GRIN lens portion with the optical fiber;
a lens mount piece for fixing to support at least one portion of the coupling lens or optical fiber so as to be capable of optically coupling the transmitted light leaving the semiconductor laser with the optical fiber via the coupling lens.

2. A semiconductor laser module according to claim 1, wherein the second GRIN lens portion has a length of a quarter of the meander period of the transmitted light propagating inside along the optical path direction.

3. A semiconductor laser module according to claim 1, wherein the second GRIN lens portion is divided into a collimator lens portion connected by fusion with the first GRIN lens portion and a collective lens portion connected by fusion with the optical fiber so as to be capable of aligning an optical isolator therebetween.

4. A semiconductor laser module according to claim 1, wherein the lens mount piece has, at least, a groove for fixing to support the coupling lens inside.

* * * * *